(12) United States Patent
Huang et al.

(10) Patent No.: US 9,071,196 B2
(45) Date of Patent: Jun. 30, 2015

(54) DOUBLE BALANCED MIXER WITH SWITCHING PAIRS COMPLEMENTARY TO EACH OTHER

(76) Inventors: Qiuting Huang, Zollikon (BE); Jürgen Rogin, Meilen (DE)

(*) Notice: Subject to any disclaimer, the term of this patent is extended or adjusted under 35 U.S.C. 154(b) by 430 days.

(21) Appl. No.: 11/631,822

(22) PCT Filed: Jul. 1, 2005

(86) PCT No.: PCT/EP2005/007113
§ 371 (c)(1),
(2), (4) Date: Jan. 4, 2007

(87) PCT Pub. No.: WO2006/002945
PCT Pub. Date: Jan. 12, 2006

(65) Prior Publication Data
US 2008/0032646 A1 Feb. 7, 2008

(30) Foreign Application Priority Data

Jul. 6, 2004 (GB) .................................. 0415179.1
Apr. 22, 2005 (GB) .................................. 0508203.7

(51) Int. Cl.
*H04B 1/26* (2006.01)
*H03D 7/14* (2006.01)

(52) U.S. Cl.
CPC ........... *H03D 7/1441* (2013.01); *H03D 7/1433* (2013.01); *H03D 7/1458* (2013.01); *H03D 7/1483* (2013.01); *H03D 7/1491* (2013.01); *H03D 2200/0043* (2013.01); *H03D 2200/0047* (2013.01); *H03D 2200/0084* (2013.01)

(58) Field of Classification Search
USPC ................. 455/296, 302, 310–312, 313–333, 455/343.1
See application file for complete search history.

(56) References Cited

U.S. PATENT DOCUMENTS 3,974,452 A * 8/1976 Cunningham ............. 455/154.2
4,253,196 A * 2/1981 Malchow ...................... 455/319
(Continued)

FOREIGN PATENT DOCUMENTS

GB 2321148 A 7/1998

OTHER PUBLICATIONS

PCT International Search Report dated Sep. 27, 2005, in related PCT Patent Application No. PCT/EP2005/007113, filed Jul. 1, 2005.
(Continued)

*Primary Examiner* — Edward Urban
*Assistant Examiner* — Rui Hu
(74) *Attorney, Agent, or Firm* — Stout, Uxa & Buyan, LLP; Frank J. Uxa; Carlos A. Fisher

(57) ABSTRACT

A double balanced mixer has a DC detection circuit connected to receive the output of the mixer core. The detected level is applied to adjust the duty cycle of the transistors of the mixer core. In one example, this adjusting level is added to the local oscillator signals that are applied to the core. In another example, the level is applied to adjust the threshold of the transistors of the mixer core. In a further example, the duty cycle of the local oscillator signals is adjusted before it is applied to the mixer core Also provided is an input stage for a double balanced mixer core, which comprises a transistor having a low pass filter as a feedback circuit.

55 Claims, 12 Drawing Sheets

(56) References Cited

U.S. PATENT DOCUMENTS

| | | | |
|---|---|---|---|
| 4,468,631 A * | 8/1984 | Goldberg | 330/284 |
| 5,375,258 A * | 12/1994 | Gillig | 455/87 |
| 5,510,738 A * | 4/1996 | Gorecki et al. | 327/103 |
| 5,613,233 A * | 3/1997 | Vagher | 455/296 |
| 5,634,207 A * | 5/1997 | Yamaji et al. | 455/323 |
| 5,654,674 A * | 8/1997 | Matsuno | 331/1 R |
| 5,995,819 A * | 11/1999 | Yamaji et al. | 455/326 |
| 6,023,196 A * | 2/2000 | Ashby et al. | 330/290 |
| 6,034,990 A * | 3/2000 | Kang | 375/219 |
| 6,157,822 A * | 12/2000 | Bastani et al. | 455/323 |
| 6,393,260 B1 | 5/2002 | Murtojärvi et al. | 455/91 |
| 6,408,340 B1 * | 6/2002 | Janssen et al. | 709/248 |
| 6,472,925 B1 * | 10/2002 | Komurasaki et al. | 327/361 |
| 6,711,397 B1 * | 3/2004 | Petrov et al. | 455/324 |
| 6,763,228 B2 * | 7/2004 | Prentice et al. | 455/127.2 |
| 6,791,415 B2 * | 9/2004 | Mitteregger | 330/260 |
| 6,937,849 B2 * | 8/2005 | Kluge et al. | 455/333 |
| 7,239,199 B1 * | 7/2007 | Chien et al. | 330/9 |
| 7,248,850 B2 * | 7/2007 | Shen | 455/318 |
| 7,266,352 B2 * | 9/2007 | Soe et al. | 455/209 |
| 7,280,815 B2 * | 10/2007 | Pellat et al. | 455/326 |
| 7,369,837 B2 * | 5/2008 | Kim | 455/322 |
| 7,398,073 B2 * | 7/2008 | Pullela et al. | 455/313 |
| 7,489,916 B1 * | 2/2009 | Farias et al. | 455/315 |
| 7,492,226 B2 * | 2/2009 | Kim et al. | 330/261 |
| 7,493,097 B2 * | 2/2009 | Ismail et al. | 455/285 |
| 7,515,000 B1 * | 4/2009 | Jin et al. | 330/279 |
| 7,519,335 B2 * | 4/2009 | Butaye et al. | 455/91 |
| 7,529,529 B2 * | 5/2009 | Taylor | 455/130 |
| 7,536,165 B2 * | 5/2009 | Redman-White | 455/333 |
| 2002/0160740 A1 | 10/2002 | Hatcher et al. | 455/317 |
| 2003/0112049 A1 * | 6/2003 | Wang | 327/307 |
| 2003/0112072 A1 * | 6/2003 | Kim | 330/254 |
| 2003/0146789 A1 * | 8/2003 | Mitteregger | 330/260 |
| 2003/0216128 A1 * | 11/2003 | Zhou | 455/127.1 |
| 2004/0017862 A1 * | 1/2004 | Redman-White | 375/319 |
| 2004/0164797 A1 * | 8/2004 | Reber | 330/86 |
| 2004/0242178 A1 * | 12/2004 | Kim et al. | 455/234.1 |
| 2005/0266806 A1 * | 12/2005 | Soe et al. | 455/88 |
| 2006/0148438 A1 * | 7/2006 | Manku | 455/313 |
| 2009/0233570 A1 * | 9/2009 | Wang | 455/323 |

OTHER PUBLICATIONS

UK Patent Office Search Report dated Nov. 17, 2004, in related UK Patent Application No. GB0415179.1, filed Jul. 6, 2004.

K. Kivekäs et al., "Characterization of IIP2 and DC-Offsets in Transconductance Mixers", *IEEE Transactions Circuits and Systems-II: Analog and Digital Signal Processing*, vol. 48, No. 11, pp. 1028-1038, Nov. 2001.

D. Manstretta et al., "Second-Order Intermodulation Mechanisms in CMOS Downconverters", *IEEE J. Solid-State Circuits*, vol. 38, No. 3, pp. 394-406, Mar. 2003.

J. Ryynänen et al., "A Single-Chip Multimode Receiver for GSM900, DCS 1800, PCS 1900, and WCDMA", *IEEE J. Solid-State Circuits*, vol. 38, No. 4, pp. 594-602, Apr. 2003.

* cited by examiner

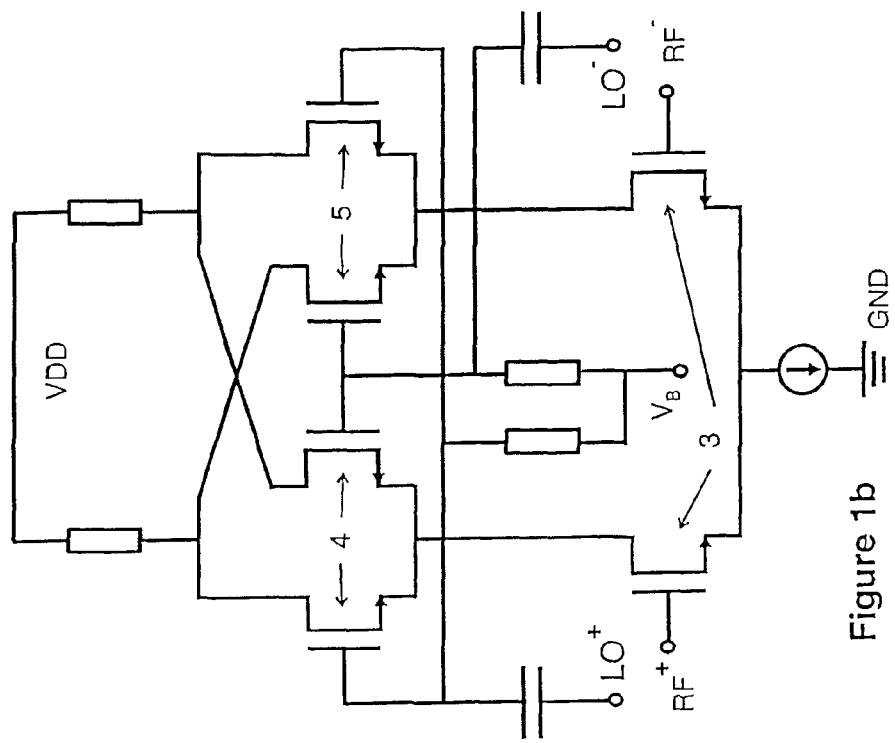
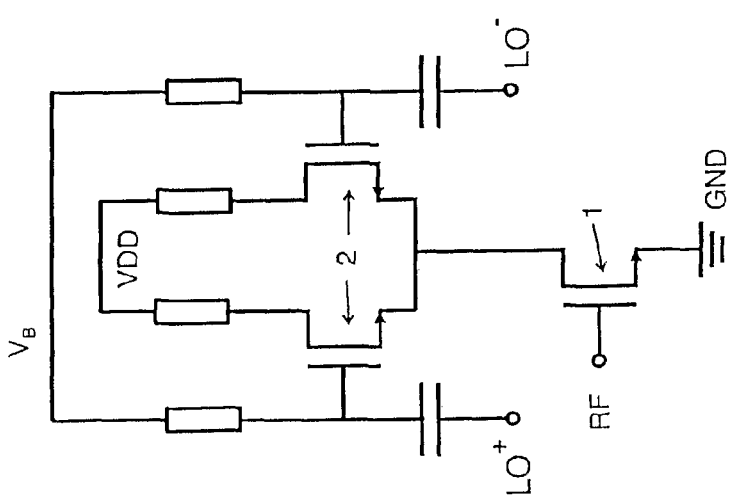
Figure 1b
Figure 1a

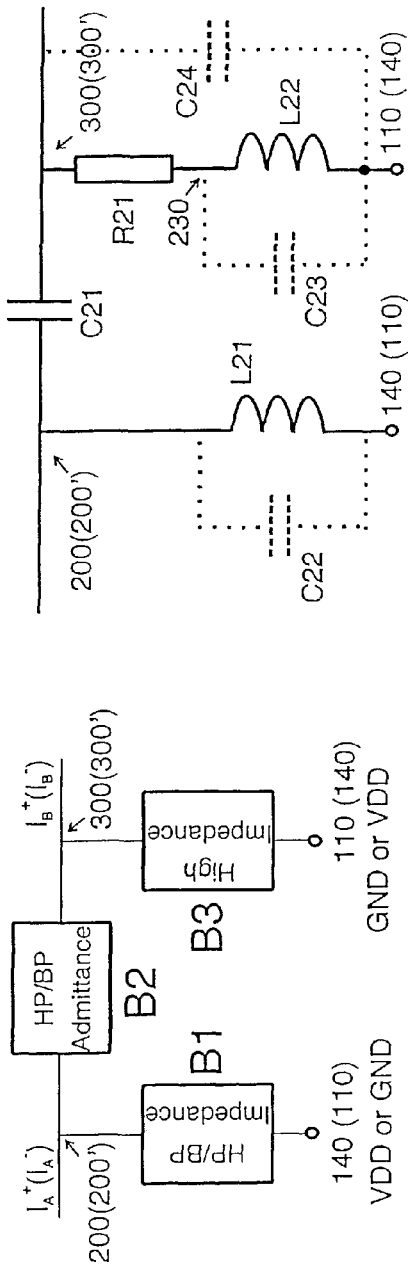
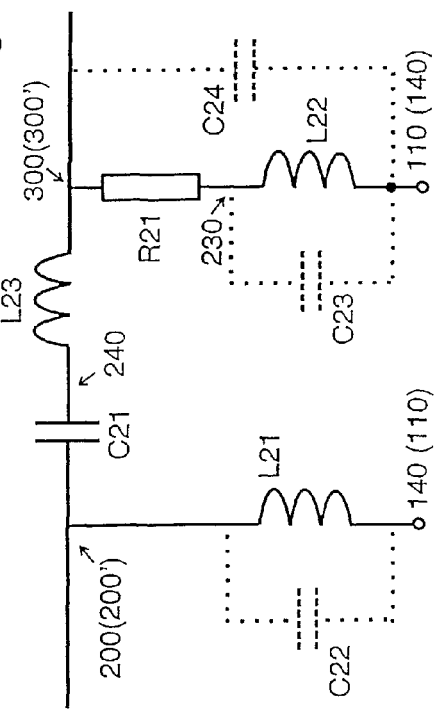
Figure 4a
Figure 4b
Figure 4c

DOUBLE BALANCED MIXER WITH SWITCHING PAIRS COMPLEMENTARY TO EACH OTHER

FIELD OF THE INVENTION

This invention relates to mixers typically used in radio frequency (RF) receivers. In particular it relates to a double balanced mixer with high even-order intercept points.

BACKGROUND OF THE INVENTION AND RELATED ART

A mixer is an essential building block in a radio frequency (RF) receiver for translating in frequency a modulated signal from being centered about the RF carrier or an intermediate frequency (IF) to being centered about DC, where it is referred to as the baseband (BB) signal. In the remainder of this document references to RF frequencies or RF signals equally apply to mixers whose inputs are signals at IF frequencies. The elements that actually perform the frequency translation are commutating switches (mixer core) that direct an RF current alternately to the opposite sides of the load impedance. Mathematically the differential voltage across the load is equal to the RF current multiplied by the differential load impedance and an alternating sequence of 1s and −1s. The said sequence is the effective commutating function that in an ideal, balanced configuration should have 50% duty cycle. As the RF input is often a voltage, transistors are mostly used to convert the said RF voltage into current before the commutating switches. The combination of the transistors performing the voltage-to-current (V-I) conversion (transconductor), commutating switches and load impedance, as shown in FIG. 1, are commonly known as an active mixer. A single-transistor transconductor 1 followed by one pair 2 of differential or balanced switching transistors, as shown in FIG. 1a, is referred to as a single balanced mixer. A differential or balanced transconductor 3 followed by two pairs 4, 5 of balanced switching transistors, as shown in FIG. 1b, is referred to as a double balanced mixer. Constructed with active devices, both the transconductor 1, 3 and the commutating switches 2, 4, 5 may have nonlinear signal transfer characteristics of both even and odd order.

In many applications large interfering, radio frequency, signals called blocking signals are present at the input of the mixer together with the desired input signal. Although there is usually a reasonably large frequency separation between the desired and blocking signals, passive RF filters prior to the mixer can only attenuate the blocking signals to a limited extent. Residual blocking signals reaching the mixer input may be translated to the baseband by even-order nonlinearity in the demodulator. The phenomenon is loosely referred to as envelope detection because any amplitude modulation present in the blocking signal will be converted into a varying signal in the baseband, in addition to the DC component representing the average power of the undesired BB signal. Even-order nonlinearity in the RF receiver in general and mixers in particular can therefore adversely affect the detection of the desired signal in zero-IF (direct conversion) and low-IF receiver architectures because the said desired signal is directly frequency-shifted to the baseband before sufficient amplification. A commonly used figure of merit for describing linearity in terms of second order distortion is known as second order intercept point or IP2. Similarly, higher even order distortion can be described by IP4 for fourth order, IP6 for sixth order, etc, intercept points. Low-IF or direct conversion architectures require mixers with high even-order intercept points.

In a fully differential or balanced mixer implementation, the blocking signals envelope-detected by even-order nonlinearity should ideally be equal at both the positive and the negative output nodes so that the differential output is zero, leaving the desired signal unaffected. Inevitable mismatch of a practical implementation of the positive and negative signal paths of the mixer, however, results in imperfect cancellation of the envelope-detected blocking signal. Well-matched differential circuits are therefore also considered to have high IP2. Since RF devices tend to be small in order to achieve high frequency operation, matching accuracy among them is limited. Typical achievable IP2 by a fully integrated mixer is 40–50 dBm, which is insufficient for advanced applications such as WCDMA, in which a mobile phone's transmitter signal leaks through the duplexer into the phone's own receiver, where it acts as a blocking signal. Without an expensive SAW filter after the low noise amplifier (LNA), the receiver's mixers would require an IP2 of the order of 75 dBm in a direct-conversion architecture. Such a requirement is 1000 times higher than the state-of-the-art.

Reference is now made to the following documents:
[1] K. Kivekäs, A. Pärssinen and K. Halonen, "Characterization of IIP2 and DC-Offsets in Transconductance Mixers", IEEE Trans. Circuits and Systems, Vol. 48, No. 11, pp. 1028-1038, November 2001
[2] D. Manstretta et al, "Second-Order Intermodulation Mechanisms in CMOS Downcoverters", IEEE J. Solid-State Circuits, Vol. 38, No. 3, pp. 394-406, March 2003
[3] Jussi Ryynänen et al, "A Single-Chip Multimode Receiver for GSM900, DCS 1800, PCS 1900 and WCDMA", IEEE J. Solid-State Circuits, Vol. 38, No. 4, pp. 594-602, April 2003

Both references [1] and [2] identify many sources of nonlinearity in the mixer, which must all be properly addressed if any method is to improve the overall IP2 significantly. Recognizing the influence of circuit mismatch on envelope detection, reference [3] suggested trimming the load impedance at the mixer output during power-up as a way to improve IP2. U.S. Pat. No. 6,393,260 B1 discloses a trimming method to improve mixer balance by empirical bias adjustment based on repeated measurements. Perfect balance is however not generally possible for a double balanced mixer without separately adjusting the pair of transconductor transistors and each pair of switching transistors. Performed outside the normal operation of the mixer, the method also requires memory elements, A/D and D/A converters and preferably an RF test signal source, which adds a large cost overhead. The requirement of an RF test signal makes the method mostly suitable for production testing only and the non-volatile memory needed to store the final settings requires special integration technology.

SUMMARY OF THE INVENTION

In view of the foregoing, it is an object of the present invention to provide a method and circuit arrangement that substantially improve the even-order intercept points of a double balanced mixer without necessarily interrupting the normal operation of the said mixer, nor the need of a special RF test signal.

The invention is based, in one aspect, on the recognition of the fact that if all DC or low frequency differential signals can be prevented from reaching the commutating switches then envelope detection will be limited to that caused by the nonlinearity of the commutating switches alone.

The common-mode low-frequency signals envelope-detected by the said nonlinearity of the commutating switches, on the other hand, can be effectively removed even if the mixer is not balanced. The essential requirement is that the mixer be driven in such a way that the effective commutating functions realized by the two switching transistor pairs in a double balanced mixer have complementary duty cycles.

According to one aspect of the present invention there is provided a circuit arrangement wherein any DC or low frequency signal generated as a result of nonlinearity acting upon a high frequency blocking signal is prevented from reaching the commutating switches (or at least is significantly attenuated) using filters, in conjunction with a negative feedback regulation.

According to another aspect of the present invention, there is provided a circuit arrangement wherein the said two (or more) switching transistor pairs are driven by two (or more) separate switching signals with individually variable duty cycles or thresholds, such that the said commutating functions are made complementary to one another even if the said transistor pairs have different imbalances. (In the case of threshold adjustment this can be done either before the switching signals are applied to the switching transistor pairs or by applying an adjustment signal for the threshold directly to the transistors by applying the adjustment signal to the threshold connections of the transistors. In the latter case since the adjustment to the threshold is fed directly to the transistors and the adjustment to the switching signals is made in situ only a single common local oscillator signal, which is part of the switching signal, is fed to the control terminal (e.g. gate) of the transistors.)

Preferably, the said filtering method is combined with the said commutating functions of complementary duty cycles to prevent all envelope-detected blocking signals from reaching the mixer output.

In particular, according to the invention, there are provided double balanced mixer circuits as defined in the appended claims.

An advantage of the invention is that it can cope with blocking signals without the use of an expensive SAW filter. More particularly the circuit provided can all be fabricated using integrated circuit technology, preferably in a single integrated circuit.

The invention is of use, amongst other things, in mobile telephones or in any other kind of mobile terminal station, for example, PDA's with wireless mobile data connectivity or a similarly enabled laptop computer; in the latter the wireless connection is provided, for example, in a PC card, which may for example send data using GPRS.

BRIEF DESCRIPTION OF THE DRAWINGS

Preferred embodiments of the present invention will now be described in greater detail, by way of example only, with reference to the accompanying drawings, of which:

FIG. 1a is a schematic diagram of a prior art single balanced mixer.

FIG. 1b is a schematic diagram of a prior art double balanced mixer.

FIG. 4a is a block diagram of a highpass/bandpass passive network in accordance with the present invention.

FIG. 4b is a schematic diagram of a preferred highpass embodiment of the passive network in accordance with the present invention.

FIG. 4c is a schematic diagram of a preferred bandpass embodiment of the passive network in accordance with the present invention.

FIG. 6b is an alternative form of the circuit of FIG. 6a

DETAILED DESCRIPTION OF THE INVENTION

Figure 2:
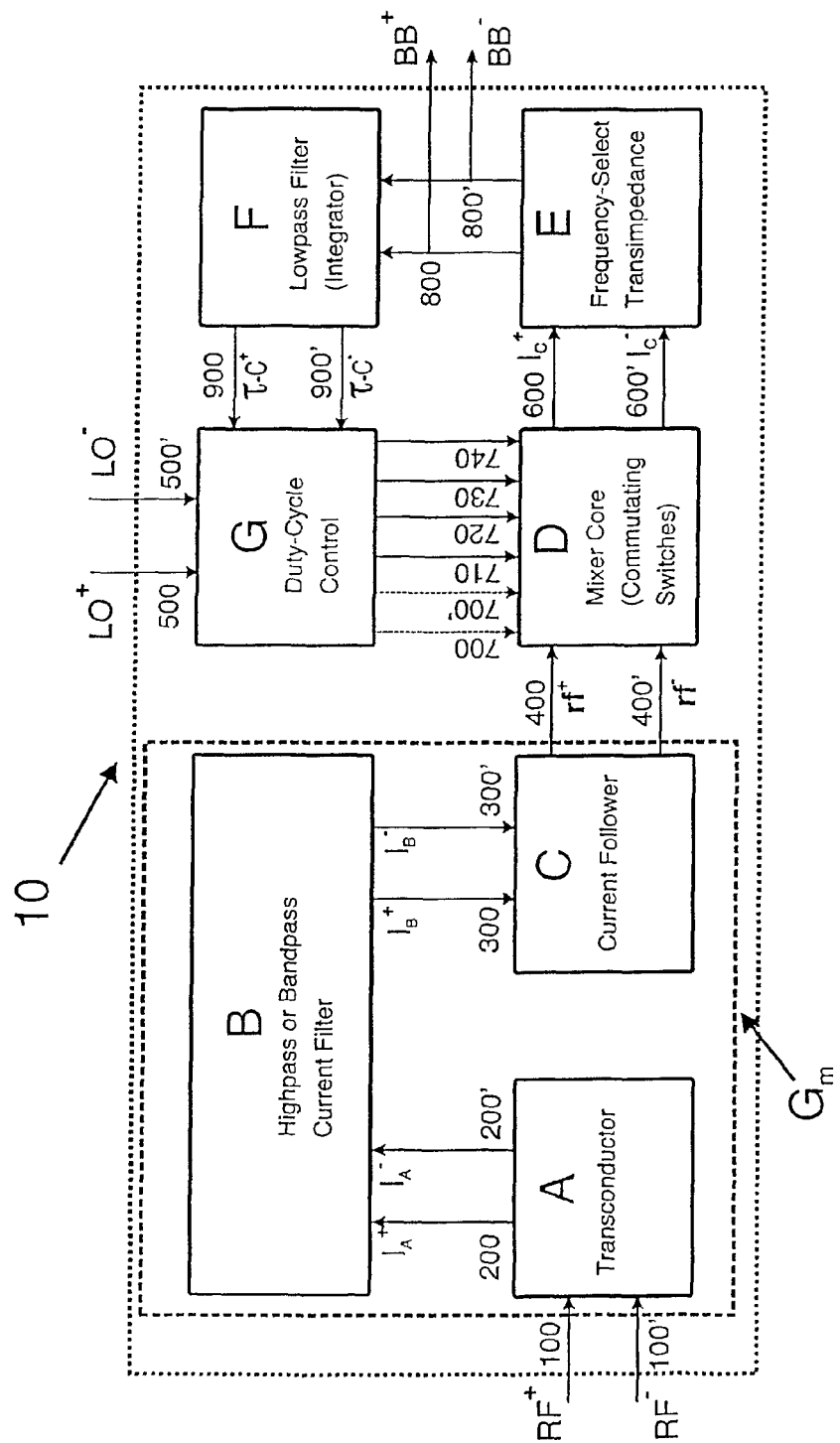
FIG. 2 is a block diagram of a double balanced mixer in accordance with the present invention.

In the preferred embodiment, a mixer circuit in accordance with the invention comprises, as shown in FIG. 2, a transconductor A, a passive two-port network B, a current follower C, a mixer core D, a transimpedance stage E, a lowpass filter F and a duty-cycle control block G. In summary the mixer circuit operates as follows.

At its boundary the overall mixer circuit 10 has a first overall input port RF, a second overall input port LO and an overall output port BB. The input port RF receives the radio frequency signal carrying the information to be frequency-shifted—it will, of course also receive any blocking signal present. The input port LO receives a local oscillator signal. The output port BB provides the frequency-shifted output signal.

The input port RF is provided by the input of transconductor A. The transconductor A converts the received RF signal into a differential RF current at its output. That differential RF current enters the input port of passive network B, whose current transfer characteristic is highpass or bandpass, so that the current reaching the output port of passive network B is essentially free of DC or low frequency components. (However, this simple filter still passes, in most cases, the blocking signal, which is why prior art devices often use a SAW filter to eliminate the blocking signal.)

The output port of passive network B is connected to the input port of the current follower C. The current follower C comprises active devices and has feedback regulation, provided by feedback amplifiers, to achieve very low input impedance and very high output impedance, especially at low frequencies and DC. In addition to realizing an impedance transformation, the current follower C may also serve a useful function of level conversion of bias voltage to facilitate mixer operation under low supply voltage. To prevent any nonlinearity of the feedback amplifiers from introducing low frequent distortion into the output current (i.e. from envelope detection of the blocking signal), the negative input of the feedback amplifiers is isolated at RF frequencies from the input of the said current follower C by a lowpass filter (C2 in FIG. 5a) in each differential branch. Optionally, the outputs of the said lowpass filters of the two differential branches can be sensed by a low-offset integrator and the differential output of the integrator is fed back to the positive inputs of the feedback amplifier so as to reduce the voltage offset at the input of the current follower C.

The output of the current follower C is fed to the rf port of the mixer core D. The mixer core D also has an LO input port which may, in the embodiments described, include up to three individual input ports to receive either synchronized LO signals or threshold adjustment control.

The output current of the mixer core is fed to the input of the transimpedance amplifier E. The output voltage of the transimpedance amplifier E is also the overall output BB of the double-balanced mixer 10. The overall output BB is fed to the input of the lowpass filter or integrator F.

The output of the lowpass filter F is the first of the two inputs of the duty-cycle control block G. The second input of the duty-cycle control block G is the overall input port LO of the mixer 10. The duty-cycle control block G has an output port, which may have up to three (in the embodiments described) individual output ports to provide synchronized LO outputs and threshold control signals needed by the mixer core D to realize the effective commutating functions of complementary duty cycles that were noted above.

Details of the individual blocks A-G now follow. It will also be useful to refer to the overall detailed circuit diagram of FIG. 10. This comprises only certain ones of the possible circuits described below. A note at the end of this description records which particular ones are used.

Figure 3C:
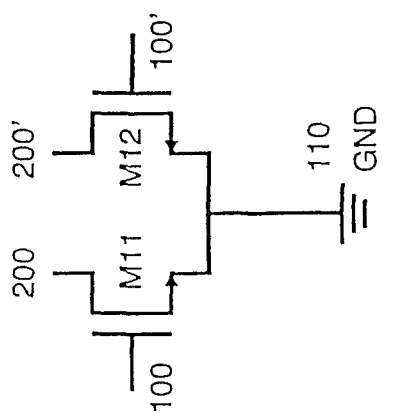
FIG. 3c is a schematic diagram of a common-gate NMOS implementation of the transconductor shown in FIG. 2.
Figure 3B:
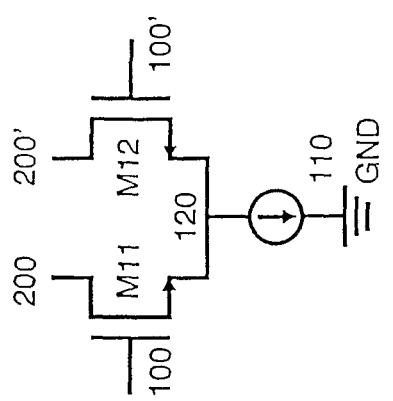
FIG. 3b is a schematic diagram of a common-source NMOS differential pair implementation of the transconductor shown in FIG. 2.
Figure 3A:
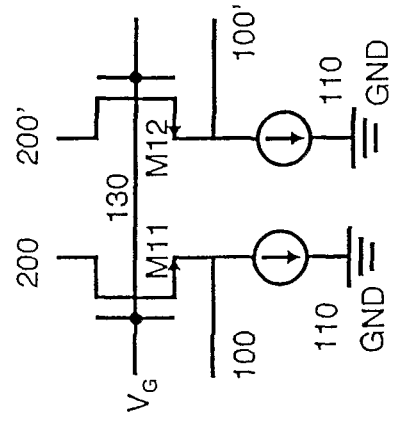
FIG. 3a is a schematic diagram of a pseudo differential common-source NMOS implementation of the transconductor shown in FIG. 2.

FIG. 3 shows three examples of well-known transconductor circuits, which may be used as the transconductor A in the present invention. Each consists primarily of a pair of transistors, preferably for example NMOS transistors, that perform voltage to current conversion. Depending on the need to provide impedance matching looking into the RF input 100, 100' the pair of transistors can be arranged in common-source configuration as in FIG. 3a and FIG. 3b or common-gate configuration as in FIG. 3c. In all cases the differential RF input voltage is applied between terminals 100 and 100' and differential output current is provided between terminals 200 and 200'. (In the Figures 110 or GND denotes ground and 140 or VDD the positive power supply). The examples are illustrated with NMOS transistors without source degeneration but it should be obvious to those skilled in the art that PMOS transistors and bipolar transistors of both NPN and PNP types can be used in a similar fashion. Source or emitter degeneration can also be used for linearizing the transconductance or impedance matching.

FIG. 4a is a block diagram of one of the differential branches of the current filter B. One such circuit is connected between output 300 and input 200 (see FIG. 2) and another, matched, circuit between output 300' and input 200'. The said current filter comprises a highpass (HP), or bandpass (BP), impedance B1, a highpass, or bandpass, admittance B2 and a biasing impedance B3. B1 provides the bias path for the DC current of the transconductor A, but is high impedance at RF frequencies. Low frequency or DC current components generated in response to the RF input 100, 100' by the transconductor A's nonlinearity are therefore shunted from terminals 200-200' to the AC ground VDD (or GND). In FIGS. 4a, 4b and 4c the option of B1 being connected to GND or B3 to VDD is used respectively if transistor M11 (or M12) (see FIG. 3) is PMOS or if transistor M31 (or M32) (see FIG. 5) is PMOS.

The HP or BP admittance B2, on the other hand, is high admittance (low impedance) at RF frequencies and high impedance at low frequencies. Provided that the current follower circuit C following the current filter B has low input impedance seen from terminals 300-300', the said RF signal current will mostly flow through the HP/BP admittance B2 into the said current follower circuit C. The DC blocking provided by B2 enables the operating voltage of the subsequent circuit functions to be set independently from that of the transconductor output 200-200', a desirable feature for the low voltage operation characteristic of modern integrated circuits.

The impedance B3 shunting terminals 300-300' provides the bias path for the current follower C to the GND (or the VDD) terminal of the power supply. Current sources (shown in dashed form in FIG. 5) may replace the function of B3 if they can be made sufficiently linear. Although bias constraints under low supply voltage may restrict the achievable impedance of B3 the impedance needs to be substantially higher than that of the said input impedance of current follower C. At RF frequencies this high ratio of B3 impedance to C input impedance limits the loss of RF signal current. At DC and low frequencies the high ratio prevents any spurious low-frequency signal produced by the nonlinear active devices of the current follower C from flowing back into the said impedance B3.

FIG. 4b is the schematic diagram of a first implementation of each of the two differential paths of the current filter B (only one of the two matched paths is shown). This is a highpass implementation, i.e. it passes the desired RF signals with even higher frequency signals also being allowed to pass but there will be little of these or they can be tolerated in downstream circuitry. In this implementation admittance B2 comprises a capacitor C21, impedance B1 an inductor L21 and high impedance B3 a resistor R21 and inductor L22 in series. In dashed form C22, C23 and C24 indicate likely parasitic capacitors in an integrated circuit implementation that may modify the effective transfer function from a highpass to a bandpass characteristic, a fact that may be used advantageously during design. The capacitors C22, C23 and C24 may also be implemented intentionally to achieve the said bandpass characteristic.

FIG. 4c is the schematic diagram of an alternative implementation of each of the matched differential paths of the current filter B. This is a bandpass implementation, i.e. it passes a band of frequencies around the desired RF signals. This differs from the first implementation in that the admittance B2 comprises a capacitor C21 and an inductor L23 in series. Again, in dashed form C22, C23 and C24 indicate likely parasitic capacitors in an integrated circuit implementation that may modify the effective transfer function, a fact that may be used advantageously during design to reinforce the bandpass characteristic. The capacitors C22, C23 and C24 may also be implemented intentionally.

In the circuits of FIGS. 4b and 4c the resistor R21 and inductor L22 could be replaced by a resistor alone.

Figure 5A:
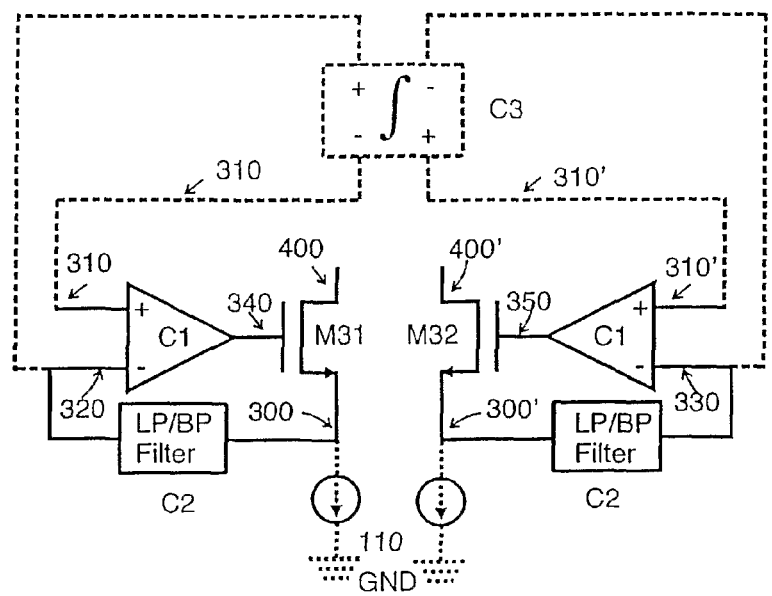
FIG. 5a is a block diagram of a NMOS embodiment of the current follower in accordance with the present invention.

The main function of the current follower C, shown conceptually in FIG. 5a, is to redirect the RF current to the mixer core D, preferably enabling more favorable bias points for the said mixer core when possible, without introducing low frequency spurious components into its output current. Considering one of the differential branches only (the other is of similar construction), a simple common-gate transistor such as M31 (here an NMOS transistor) is typically used as a current follower with a low input resistance equal to the inverse of the transistor's transconductance, and an output resistance that is high. (In particular the source is connected to node 300 and the drain provides the output current to the mixer.) The said input resistance, though quite low, still allows an RF voltage to be developed at the source of the said common-gate transistor, whose nonlinear V-I characteristic produces spurious low frequency voltage and current components at the transistor's source and drain terminals, respectively. (As noted above blocking signals may still be present, having not been eliminated by the current filter B, which would be envelope detected either in or by M31 to produce the spurious signals.) To eliminate these low frequency spurious components in the drain current (which would otherwise undesirably enter the mixer), the sum of currents entering the source of M31, minus the current shunted through the gate-source capacitor of M31, must be effectively free of low frequency components. This is achieved, according to another aspect of the present invention, by introducing a strong low-frequency feedback regulation, as shown in FIG. 5, to stabilize the source voltage of M31 on node 300. With node 300 stabilized to virtually a constant at low frequency, only node 340 has residual low frequency voltage variations due to high frequency voltage variations at node 300 and the nonlinear V-I characteristic of M31. The low frequency current injected into the source of M31 through its gate-source capacitor can be shown to be orders of magnitude lower than that would be injected into M31 without feedback regulation.

The feedback regulation is provided by feedback amplifier C1 and lowpass (or bandpass) filter C2. The feedback amplifier C1 will usually be comprised of active devices but these are liable to produce much larger low frequency spurious voltage components at node 340 if a high frequency RF signal is present at C1's inverting input 320 (which, as shown, is connected to node 300 via the lowpass filter C2). To prevent the said larger spurious low frequency signals from injecting spurious current into M31, the inverting input 320 is isolated from the current follower input 300 by the lowpass filter C2, according to the present invention.

Under the said feedback regulation, the offset voltage between node 300 and node 300' is dictated by the difference in offsets between the two regulating amplifiers C1. To reduce the influence of this offset difference on the matching between the two differential branches, there is provided an optional integrator C3, whose positive and negative inputs are nodes 320 and 330 respectively and whose outputs 310 and 310' are the positive input nodes of the said feedback amplifiers C1. Through negative feedback, the integrator C3 regulates the said offset voltage between node 300 and node 300' to the input referred offset of the said integrator C3. Since C3 is not directly in the signal path, it can be implemented with very low offset by those skilled in the art, thus making the offset between nodes 300 and 300' very low also.

Figure 5B:
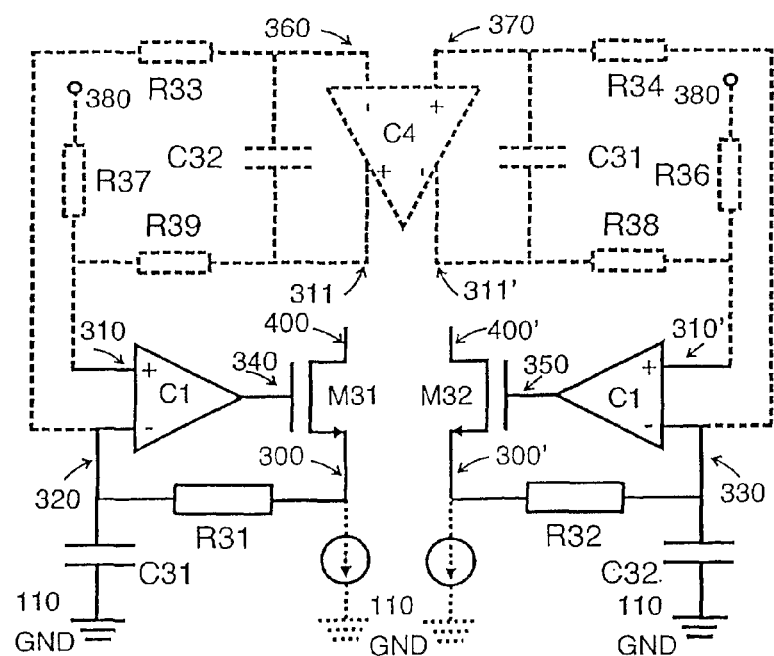
FIG. 5b is a schematic diagram of a NMOS embodiment of the current follower with an R-C implementation of the lowpass filter thereof and an active-RC implementation of the integrator thereof, in accordance with the present invention.

FIG. 5b shows a schematic diagram of a preferred implementation of the current follower C, in which the lowpass filter C2 is realized as a simple RC network and the optional integrator C3 is realized as an active-RC integrator. An alternative to the active-RC integrator is a switched-capacitor (SC) integrator. The optional integrator C3 is shown in dashed form in both FIG. 5a and FIG. 5b. Non-inverting input 310 can be connected to a constant bias when the optional integrator C3 is omitted.

In detail the circuit of the implementation is described as follows. In one path (left-hand in the diagram) the lowpass filter C2 comprises a resistor R31, connected between node 300 and the inverting input of feedback amplifier C1, and a capacitor C31 connected between GND and the inverting input. The other path is similarly constructed using components of the same values.

Both paths comprise a common differential amplifier C4, which has inverting and non-inverting inputs and inverted and non-inverted outputs. The inverting and non-inverting inputs are respectively connected to the inverting inputs 320, 330 of the feedback amplifiers C1 of the left path and right path via resistors R33 and R34. The non-inverting inputs 310, 310' of feedback amplifiers C1 are respectively connected to VDD (or to a bias voltage) 380 by resistors R37 and R36 and also to the non-inverted and inverted outputs of differential amplifier C4 respectively by resistors R39 and R38. The inverting and non-inverting inputs of amplifier C4 are also respectively connected to non-inverted and inverted outputs of the amplifier C4 by capacitors C32 and C31. Again the similarly connected components on the left and right of the diagram have similar values.

In both FIG. 5a and FIG. 5b, the preferred embodiment is illustrated with NMOS field effect transistors. It should be obvious to those skilled in the art that similar embodiments can be realized with PMOS transistors or bipolar junction transistors of either NPN or PNP types.

The combined arrangement of blocks A, B and C as shown in FIG. 2 forms an overall transconductance $G_m$ that, as explained above, is effectively free of even-order distortion without necessarily having well matched differential paths.

The remaining blocks D, E, F and G form a feedback regulation to enable the effective commutating functions realized by the mixer core D to have complementary duty cycles, thereby suppressing any low frequency spurious signals that may be generated by the switching transistors, as well as any residual spurious baseband signals arriving from the said overall transconductance $G_m$. In addition, the lowpass filtering in transimpedance E removes the blocking signals substantially prior to the overall output port BB.

Figure 6A:
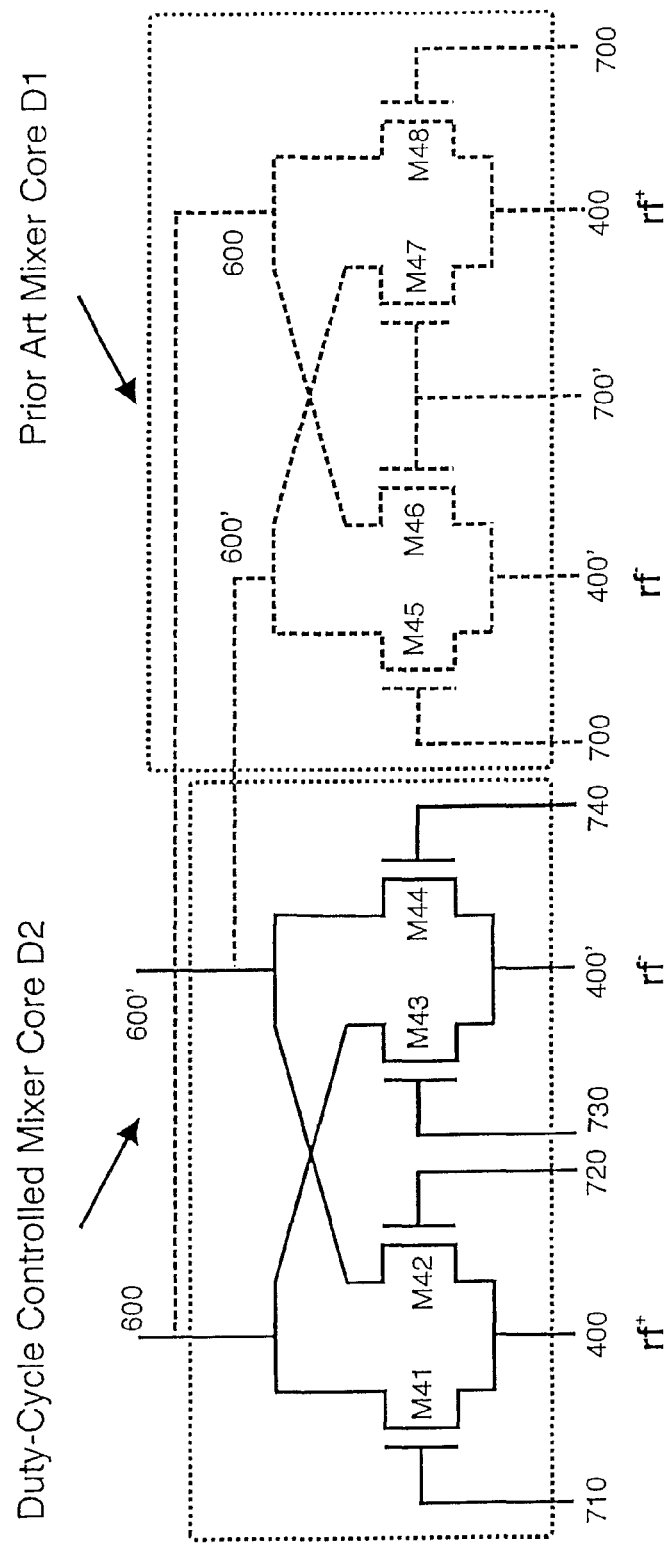
FIG. 6a is a schematic diagram of an NMOS implementation of the mixer core, in accordance with the present invention.

FIG. 6a shows a preferred embodiment of the mixer core D. The two pairs of transistors (M45, M46; M47, M48) that are drawn in dashed lines form a standard mixer core D1 (known in the prior art—compare FIG. 1b) having a differential rf input port 400-400', a control port 700-700' and output port 600-600'. The transistors are connected as follows. Transistors M45 and M46 have their sources connected to rf input node 400' and transistors M47 and M48 have theirs connected to rf input node 400. Transistors M45 and M48 have their gates connected to control input node 700 and transistors M46 and M47 have their gates connected to control input node 700'. Transistors M45 and M47 have their drains connected to output node 600' and transistors M46 and M48 have their drains connected to output node 600. This standard mixer core is an optional addition to the circuit, as is explained below. (Although a mixer core using field effect transistors has been shown, the mixer core could be constructed using bipolar transistors.)

In accordance with the present invention, however, there is provided a duty-cycle controlled mixer core D2 comprising two switching transistor pairs M41, M42; M43, M44 whose gates can be separately controlled from input ports 710-720 and 730-740, respectively. In particular the connections are as follows. Transistors M41 and M42 have their sources connected to rf input node 400 and transistors M43 and M44 have theirs connected to rf input node 400'. Transistors M41, M42, M43 and M44 have their gates respectively connected to control input nodes 710, 720, 730, 740. Transistors M41 and M43 have their drains connected to output node 600 and transistors M42 and M44 have their drains connected to output node 600'.

The bias and adaptive control circuitry for the said mixer core D is found in the duty-cycle control block G. An advantage of separating 710 from 740 and 720 from 730, compared to the prior art mixer core, is that a second control signal can be applied to port 740-730, at the same time as a first control signal is applied to port 710-720, without interrupting the normal operation of the mixer and without the said first and second control signals having to be the same. Indeed, since the objective is to achieve complementary duty cycles for the said effective commutating functions, the said first control signal is preferably of the opposite polarity to that of the said second control signal. The said complementary duty cycles can also be achieved if only one of the said control signals is adapted while the other is fixed. The circuitry providing the adjustment is explained below.

Since in practical implementations the required duty cycle adjustment is quite small, the said duty cycle controlled mixer core D2 can be optionally combined (in parallel) with a prior art mixer core D1 as shown in FIG. 6a. The duty-cycle control sensitivity can be adjusted by changing the switch transistor dimensions in D2 relative to those in D1. The prior art type mixer core D1 can however be omitted in a preferred embodiment.

Figure 6B:
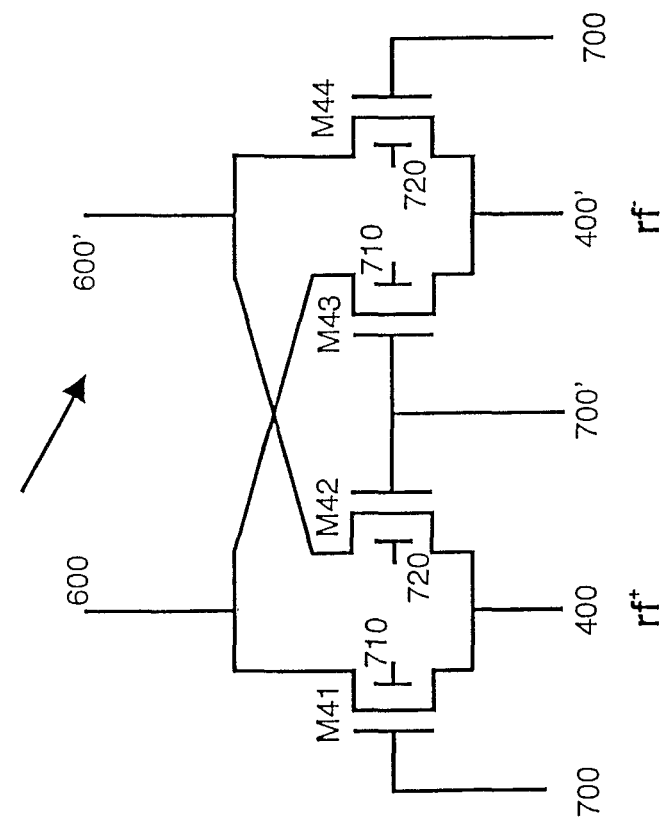

FIG. 6b is an alternative form of the circuit of FIG. 6a and is described later below.

Figure 7A:
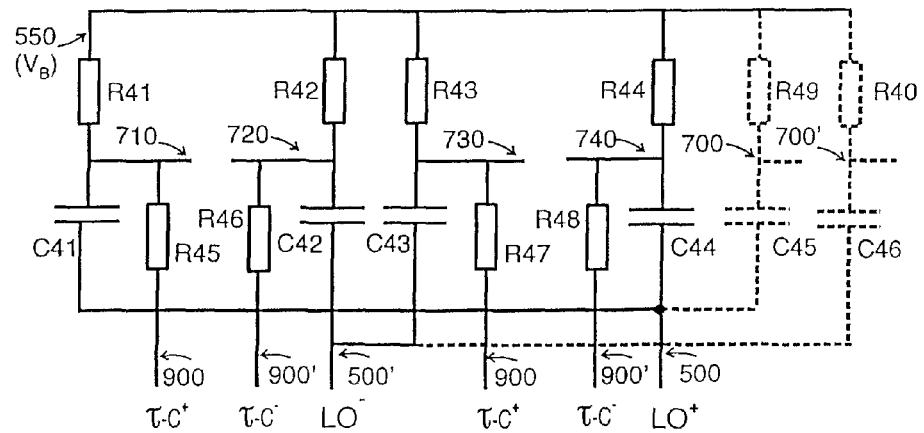
FIG. 7a is a schematic diagram of a first preferred embodiment of the duty-cycle control block, in accordance with the present invention.

A first preferred implementation of the said duty-cycle control circuit G is shown in FIG. 7a. The local oscillator signal LO is applied to a first input port 500-500' (i.e. the overall local oscillator input port in FIG. 2), the signals applied to the two terminals being in anti-phase. A duty-cycle control signal $\tau$-C is applied to a second input port 900-900'. A first output port 710-720, a second output port 740-730 provide the switching signals for the said mixer core D, i.e. those outputs being connected to the similarly numbered input ports to the mixer core (core D2 in this example, see FIG. 6a). Optionally additional components (shown in dashed form) provide a third output port 700-700' suitable for driving the additional standard mixer D1, if that is included.

The signal applied to terminal 500 is capacitively coupled, for example by capacitors C41 and C44, to nodes 710 and 740 respectively, and that applied to terminal 500' is capacitively coupled, for example by capacitors C42 and C43, to nodes 720 and 730 respectively. A constant bias voltage component $V_b$ is provided from the DC voltage source $V_B$ at node 550 to the said output ports 710-720, 740-730 and 700-700' through resistive coupling, i.e. via resistors R41, R42, R44, R43, R49, R40 respectively. The duty cycle control signal $\tau$-C is superimposed on the said bias voltage component $V_b$ at least at one of two the said output ports 710-720 and 740-730 by resistive coupling, i.e. at least node 900 is connected to node 710 by, for example, a resistor R45 and node 900' is connected to node 720 by, for example, a resistor R46. Optionally, additionally node 900 is resistively connected to node 730 and node 900' is resistively connected to node 740 (for example by resistors R47 and R48).

The optional additional output port 700-700' is capacitively coupled to local oscillator input port 500-500' (for example by capacitors C45 and C46 respectively).

The circuit of FIG. 7a affects the operation of the mixer core as follows. The duty cycle control signal $\tau$-C adjusts the DC level of the local oscillator signals LO applied to the switching transistors of the mixer core, which changes the duty cycle of the switches because more (or less, as the case may be) of the local oscillator signal is above the switching threshold of the switching transistor.

The duty cycle control signal $\tau$-C is, in the illustrated embodiments, differential. For example, considering the circuit of FIGS. 6a and 7a combined, M41 is controlled by LO$^+$ adjusted by $\tau$-C$^+$ and M42 is controlled by the anti-phase LO$^-$ adjusted by $\tau$-C$^-$. This connection results in the duty cycle being adjusted and, in particular, in the corresponding edges of the switching functions of transistors M41 and M42 moving in the same direction as each other so that M41 and M42 after adjustment still switch at the same time (allowing for any mismatch between the transistors).

In the embodiment shown in FIG. 7a, the duty cycle control signal $\tau$-C is also applied to the other transistor pair of the mixer core, i.e. transistors M43 and M44. In particular M43 is controlled by LO$^-$ adjusted by $\tau$-C$^+$ and M44 is controlled by LO$^+$ adjusted by $\tau$-C$^-$. Within the pair M43 M44 the behaviour is the same as for the pair M41 M42.

Comparing between the pairs, the arrangement is that when two switching transistors, one from each pair, that are connected to drive the same output, for example, M41 and M43, both have their local oscillator signals (which are ideally in antiphase to each other) adjusted by the same signal, in that case. $\tau$-C$^+$, which means that if that adjustment signal is raised then the duty cycle of both those transistors (i.e. the proportion of the time they are on) is raised and vice versa. As noted above the ideal situation is when the two switching pairs have duty cycles that are complementary to each other, for example when the transistors driving the same output, for example M41 and M43, have complementary duty cycles. At this point the spurious signals, which are generated by the non-linearities envelope detecting the blocking signals, are, on leaving the mixer core at its positive and negative outputs 600 and 600', equal and so cancel out. The duty cycle adjustment signal is provided at a level where the cancellation of spurious signals occurs by a feedback arrangement, as is disclosed in detail below. Note that although at this point the duty cycles are complementary they are not, in general, 50% as in a balanced situation.

(M42 and M44 each switch in a complementary fashion to M41 and M43 respectively and so are in the same relationship with each other as M41 and M43, i.e. at the ideal point achieved by the feedback arrangement M42 and M44 also switch in a complementary fashion to each other.)

Also as noted above, it is possible to adjust the duty cycle of only one of the mixer core transistor pairs. This is adjusted until cancellation of the spurious signals occurs, which again is expected to be when M41 M43 switch in a complementary fashion to each other. In the case of the circuit of FIG. 7a this arrangement is achieved simply by not connecting $\tau$-C to nodes 730 and 740.

Figure 7B:
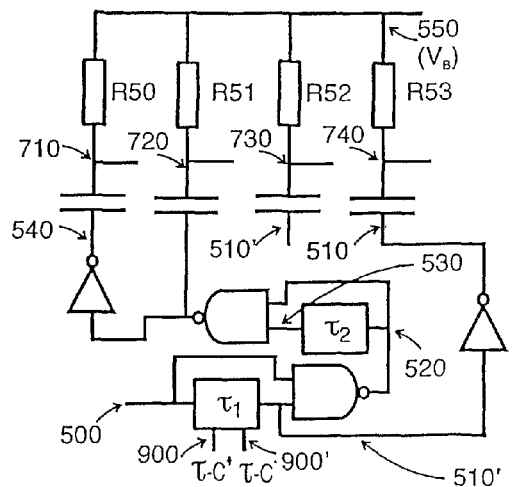
FIG. 7b is a schematic diagram of a second preferred embodiment of the duty-cycle control block in accordance with the present invention.

A second preferred implementation of the said duty cycle control circuit G is shown in FIG. 7b. In this implementation the local oscillator signal LO is first delayed by a first variable-delay circuit element $\tau_1$. The output of $\tau_1$ and LO are NAND'd by a first NAND logic circuit, the output of which is delayed by a second delay circuit element $\tau_2$. The output of the said second delay circuit element $\tau_2$ and that of the said first NAND logic are further NAND'd by a second NAND logic circuit, the output of which is capacitively coupled to node 720. The said second NAND logic circuit output is further inverted by a logic inverter, the output of which is capacitively coupled to node 710. Further, the output of the delay element $\tau_1$ is capacitively coupled to node 730. The same $\tau_1$ output is also inverted by a logic inverter, the output of which is capacitively coupled to node 740. The output nodes 710, 720, 730 and 740 of the duty-cycle control circuit D are also resistively coupled to a constant voltage source $V_B$ that provides the DC bias. Either or both delay elements $\tau_1$ and $\tau_2$ can have variable delays controlled by the duty-cycle control input 900-900', so that the duty cycle of the said output 710-720 can be controlled by the difference between $\tau_1$ and $\tau_2$. (By exchanging the roles between 710-720 and 740-730 the duty cycle of the output port 740-730 could be controlled instead while accomplishing the same objective of achieving complementary duty cycles for the said effective commutating functions.)

Figure 7C:
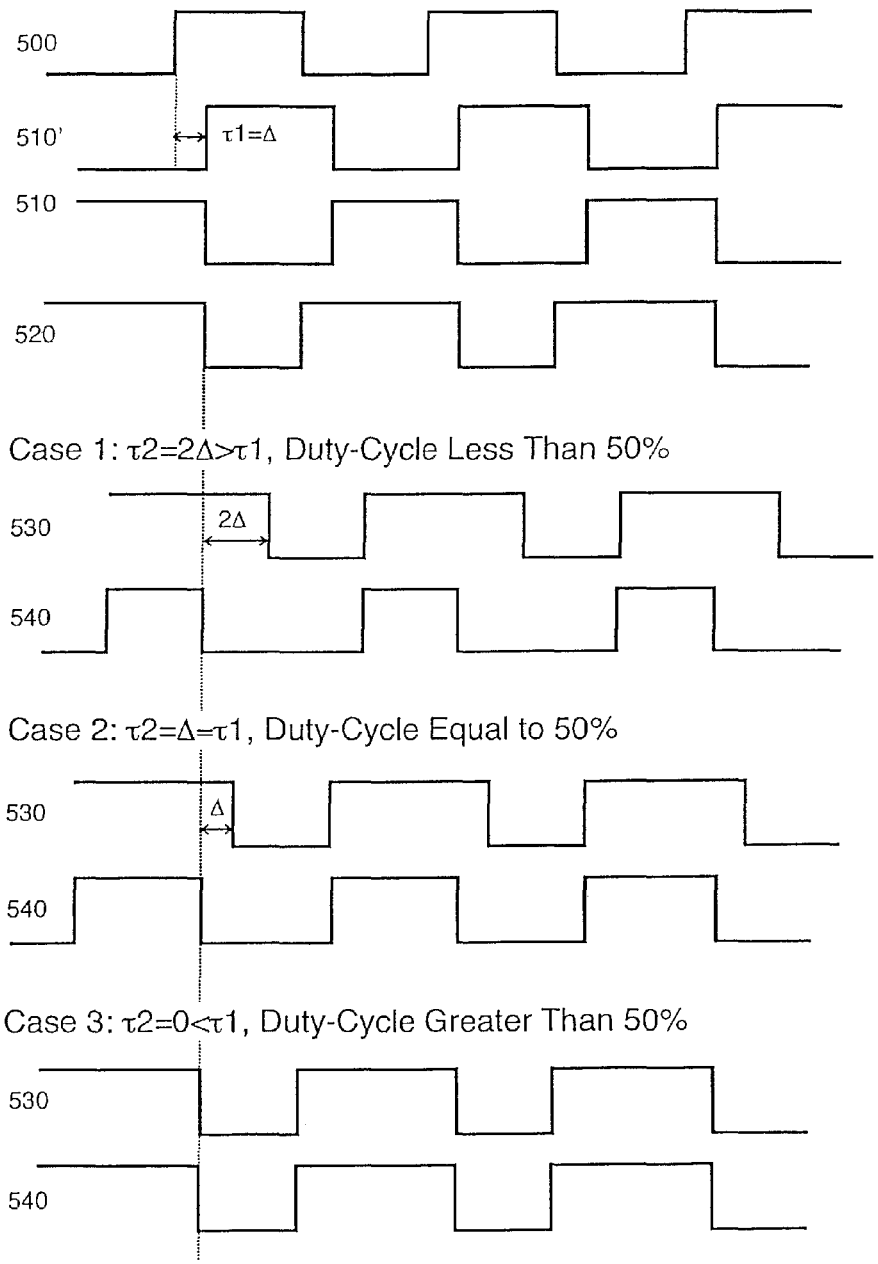
FIG. 7c is a waveform diagram illustrating the operation of the duty-cycle control block of FIG. 7b.

FIG. 7c is a waveform diagram showing the signals at various stages in the circuit of FIG. 7b. In the diagram $\tau_1$ and $\tau_2$ represent the delays provided by delay elements $\tau_1$ and $\tau_2$ respectively. The first four traces show the waveforms at earlier nodes of the circuit when $\tau_1$ equals a particular interval $\Delta$ and the following three sets of two traces show the resultant waveforms at later nodes for three cases: $\tau_2 > \tau_1$, $\tau_2 = \tau_1$, $\tau_2 < \tau_1$.

The circuit of FIG. 7b only adjusts the duty cycle of one of the pairs of transistors of the mixer core, which, as explained above is sufficient to cancel the spurious signals. It would also be possible to provide similar logic circuitry to adjust the duty cycle of the other pair. Again the duty cycle of M43 should also be increased when that of M41 is increased and reduced when that of M41 is reduced.

The preferred embodiment in FIG. 7b has single-ended circuitry. It will be obvious to those skilled in the art, however, that the said logic and delay functions, shown there with their well known symbols, can be easily implemented in differential circuit forms that are often preferred in RF applications.

In the circuit of FIG. 7b the duty cycle of the local oscillator signal LO is adjusted directly before it is applied to the mixer, which is in contrast to the circuit of FIG. 7a where the bias adjustment affects the switching times of the transistors of the mixer.

Figure 7D:
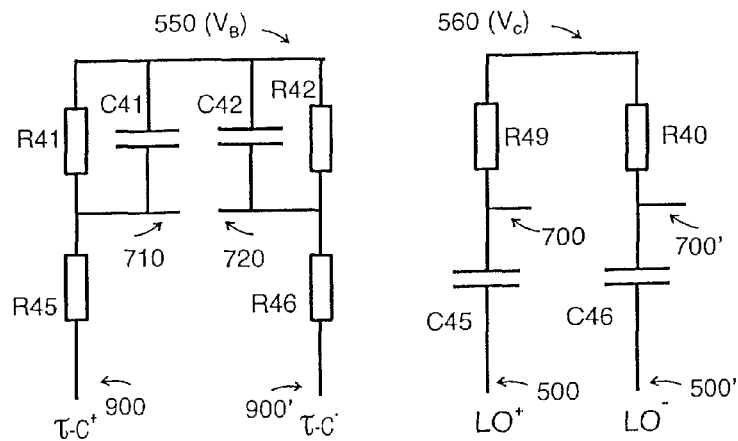
FIG. 7d is a schematic diagram of the third preferred embodiment of the duty-cycle control block in accordance with the present invention.

FIG. 7d shows a third embodiment of the duty-cycle control circuit G, which is a variation of the first embodiment shown in FIG. 7a. For this variation, as will become apparent the mixer core is modified as shown in FIG. 6b (i.e. mixer core D3).

In the first embodiment the duty cycle control circuit superposes the duty cycle control signal $\tau$-C$^+$/$\tau$-C$^-$ on to the local oscillator signal LO$^+$/LO$^-$ before the local oscillator is applied to the transistors of the mixer core. In this third embodiment the local oscillator signals are applied to the transistors of the mixer core generally as before but the duty cycle control signals are applied to the substrate connections of the mixer core transistors.

Referring now to FIGS. 7d and 6b in detail, the local oscillator signals LO$^+$/LO$^-$ are capacitively coupled to the transistors of the mixer core via respective capacitors C45 and C46, with the gates of transistors M41 and M44 receiving LO$^+$ and M42 and M43 receiving LO$^-$ as before. (Note that compared to the circuit of FIGS. 7a and 6a this uses half the number of coupling capacitors for the local oscillator signals.) Those pairs of gates are biased by connection to the bias voltage $V_C$ (560) by respective resistors R49 and R40.

Although the duty cycle control signals are connected to the substrate connections of the transistors of the mixer core D3, the connection is made via a similar passive network to that used in the first embodiment (compare FIG. 7d to FIG. 7a). $\tau$-C$^+$ is connected to the substrate connection of M41 via a voltage divider comprising resistors R45 and R41 connected in series to a constant bias voltage $V_B$ (550), with the substrate connection of M41 being connected to the node 710 between those resistors. The substrate connection of transistor M43 is also connected to node 710 and so is supplied with $\tau$-C$^+$ in the same way. (In FIG. 7d similar reference numerals have been given to these resistors as in FIG. 7a since they perform a similar function.) $\tau$-C$^-$ is similarly connected to the substrate connections of M42 and M44 via a voltage divider comprising resistors R46 and R42 connected in series also to the constant bias voltage $V_B$ (550), with the substrate connections of M42 and M44 being connected to the node 720 between those resistors.

The voltage dividers shift and scale the duty cycle control signals before they are applied to the substrate connections of the mixer core transistors. (In principle at least, it would be possible to arrange for the duty cycle control signals to be supplied by the transimpedance amplifier E and the low pass filter F such that no shifting and scaling were required. In this case the left half of the duty cycle control circuit G as shown in FIG. 7d simply becomes the nodes providing correct routing of the output of the low pass filter F to the mixer core. Equally, in principle at least it would be possible to arrange for the local oscillator signals to be supplied by the local oscillator such that no shifting and scaling were required. In that case the right half of duty cycle control circuit G as shown in FIG. 7d simply becomes the nodes providing correct routing of the local oscillator input port 500-500').

Both substrate connections 710, 720 are also connected by respective capacitors C41, C42, to the bias voltage $V_B$. This provides low pass filtering of the duty cycle control signal before it is applied to the substrate connections. (Although of course these capacitors do not couple in the local oscillator signals as the similarly numbered ones did in FIG. 7a similar numbering has been used because those capacitors in FIG. 7a also provided low pass filtering of the duty cycle control signals).

Refer now to FIG. 6b. As the duty cycle control signals applied to the substrate connections of the transistors of the mixer core D3 change they adjust the threshold voltages of those transistors and since the output of the transistors (i.e. the drain current) is dependent on the difference between the gate and threshold voltages, when the threshold voltage is adjusted in that way, again the effect is that the local oscillator signal spends a greater or lesser proportion of its time above the threshold voltage and so the duty cycle of the transistor is adjusted.

(The transistors of FIG. 7a do have substrate connections. Since they are preferably NMOS transistors their (p-type) substrate, or bulk, electrodes are connected to ground to avoid forward biasing the source to bulk and drain to bulk PN junctions. Since this has no affect in the functioning of the circuit the substrate connections were omitted from the diagram (as is conventional). In modern CMOS technologies both NMOS and PMOS transistors are mostly implemented in wells (P-well for NMOS and N-well for PMOS transistors). The substrate of a particular transistor can be isolated from those of other transistors if it is formed in a separate well. Returning to the circuit of FIGS. 7d/6b, those transistors having duty cycle control signals applied to their substrate connections are preferably isolated in separate wells).

Connecting signals to the substrate connections runs the theoretic risk of forward biasing the substrate to source and drain PN junctions. This risk is minimized by limiting the size of the duty cycle control signal during design and by taking care in the biasing arrangements (here provided by the passive network of FIG. 7d and voltage $V_B$).

In all three embodiments therefore the duty cycle control signals and the local oscillator signals cooperate to control the switching of the mixer core transistors. In the first and third embodiment this is done by applying the duty cycle control signals to the local oscillator signals to adjust the threshold at which they switch the transistors, those embodiments differing in where the duty cycle control signals are applied to the local oscillator signals. In the second embodiment the duty cycle control signals are applied to the local oscillator signals to change their mark space ratio.

Figure 8A:
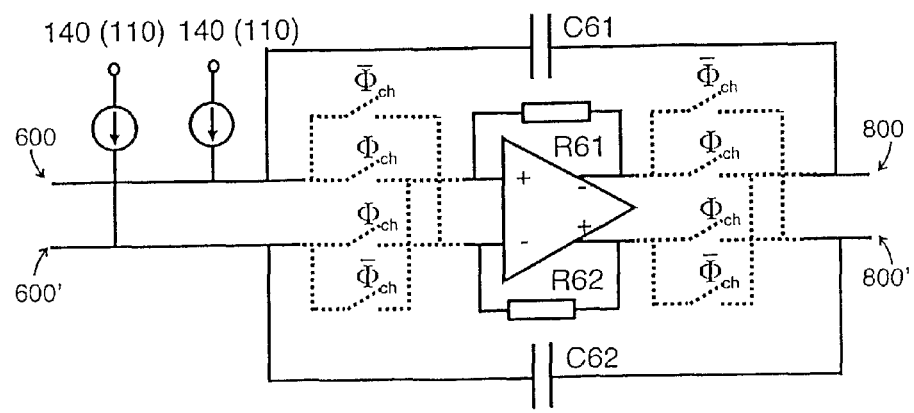
FIG. 8a is a schematic diagram of a first preferred embodiment of the frequency-select transimpedance block, in accordance with the present invention.

FIG. 8a shows a preferred implementation of the transimpedance amplifier E that converts the output current from the mixer core D to the output voltage BB of the overall mixer circuit 10. Two current sources provide the bias paths for the DC currents from the said mixer core D to the supply voltage source VDD. (The option of connecting these to 110—GND—indicates that the current sources could be replaced by current sinks). The transimpedance amplifier comprises an operational amplifier, feedback resistors R61, R62 that determine the transimpedance, and feedback capacitors C61, C62 that together with the said feedback resistors provide the lowpass filtering needed to attenuate out-of-band blocking signals. The blocking signals have also been down shifted by the mixer (but not to baseband and itself) and at these lower frequencies are more easily filtered from the desired signal (which of course is at baseband). Optionally switches, driven by a chopper clock signal, may precede the input terminals of the said operational amplifier and follow the output terminals of the same amplifier, so that the effect of offset of the said amplifier can be mitigated.

Figure 8B:
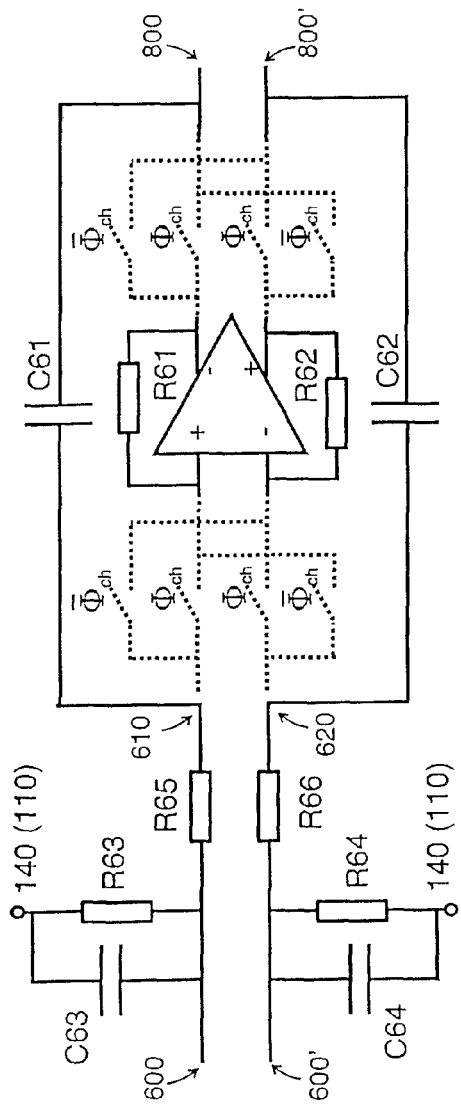
FIG. 8b is a schematic diagram of a second preferred embodiment of the frequency-select transimpedance block in accordance with the present invention.

FIG. 8b shows another preferred implementation of the transimpedance amplifier E, in which the transimpedance input is separated from the said mixer core D by resistors R65, R66. The bias current sources of FIG. 8a are replaced by parallel elements R63, C63 and R64, C64, to provide additional filtering of the blocking signals prior to the transimpedance amplifier, in addition to providing DC bias paths. The said optional switches for FIG. 8a may again precede the input and follow the output terminals of the said operational amplifier so as to mitigate the effect of offset of the said amplifier.

Figure 9:
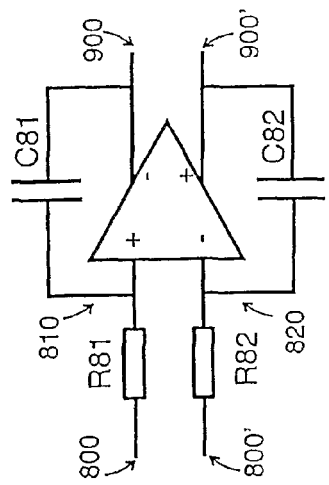
FIG. 9 is a schematic diagram of a preferred embodiment of the integrator F, in accordance with the present invention.

FIG. 9 shows a preferred implementation of an integrator/lowpass filter F designed to extract the DC component from the said BB output by substantially removing both the desired signal and the residual blocking signal components. The information contained in the said DC component about the spurious DC and low frequency responses created by the even order nonlinearity of the mixer core is used by the said duty-cycle control input 900-900' to minimize the said spurious responses. If this component is non-zero the integrator adjusts the level of the duty cycle adjustment signal, which in turn adjusts the duty cycles of the mixer core causing it to switch in a more complementary manner and reducing the DC component.

Figure 10:
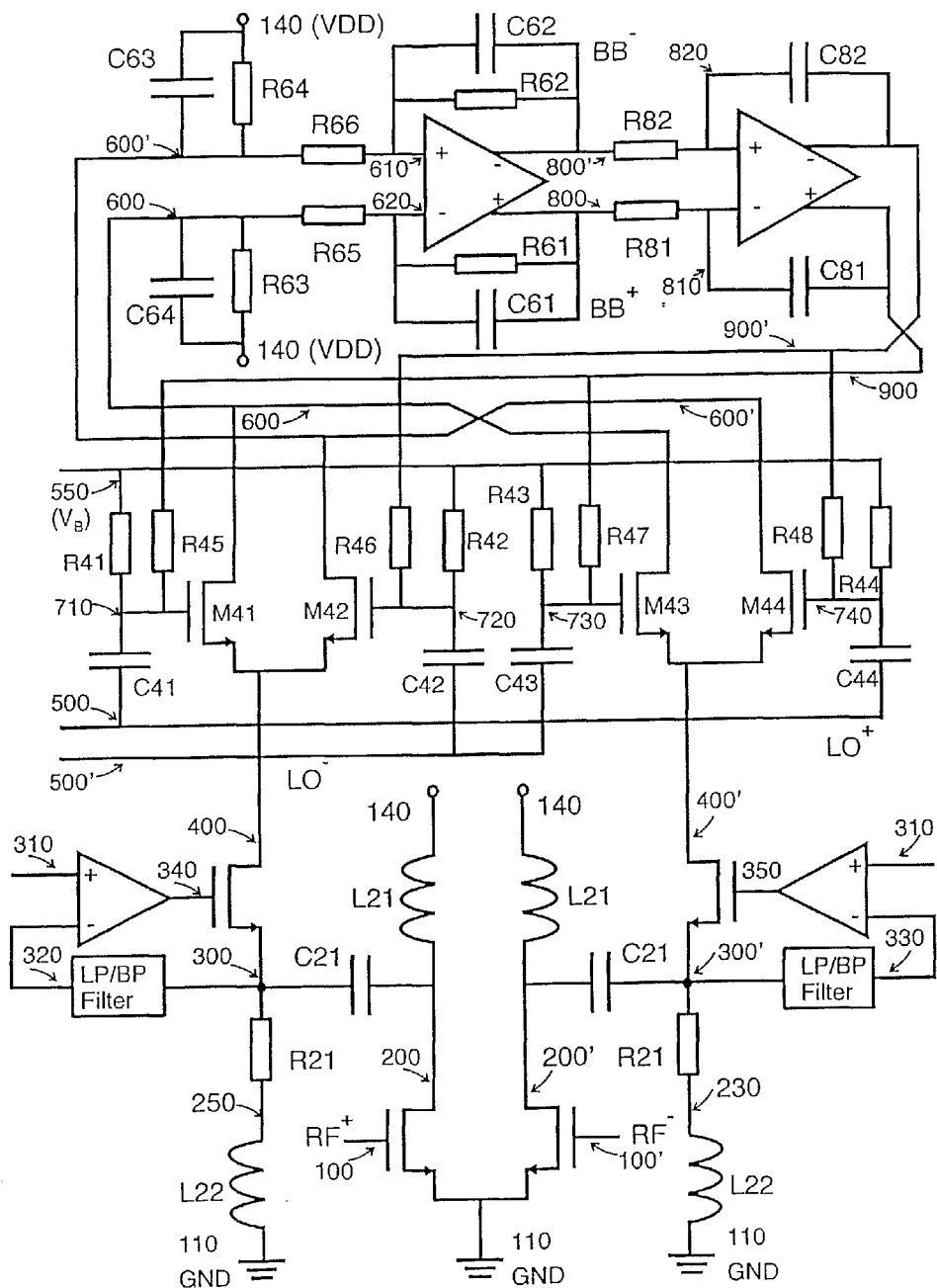
FIG. 10 is a schematic diagram of a preferred embodiment of the double balanced mixer circuit arrangement, in accordance with the present invention.

FIG. 10 shows in schematic diagram the preferred implementation of the overall high IP2 mixer 10. This comprises the particular implementations of the blocks of FIG. 2 that are illustrated in FIG. 3a, FIG. 4b, FIG. 5a (which itself is preferably implemented as the circuit of FIG. 5b—the integrator C3 is not shown in FIG. 10 but is preferably included), FIG. 6a (left-hand half only, which is the duty cycle controlled mixer core), FIG. 7a (without the dashed components), FIG. 8b and FIG. 9.

Although the said preferred embodiment is illustrated in FIG. 10 using NMOS field effect transistors, it should be obvious to those skilled in the art that all PMOS, all NPN or PNP BJT transistor realizations of a similar mixer are possible without departing from the present invention. Indeed, a mixture of NMOS, PMOS and BJT realizations for the transistors shown in FIG. 10 may enable those skilled in the art to take better advantage of the technology and supply voltage at their disposal.

While some of the preferred embodiments have been shown and described, it is to be understood that many changes and modifications can be made thereunto without departing from the invention as delineated in the appended claims.

The invention claimed is:

1. A double balanced mixer comprising:
a mixer core having a radio frequency input port, a local oscillator input port, an output port, the mixer core comprising a first pair of switching transistors, each connected to switch, in anti-phase to the other of the first pair of switching transistors, in response to the local oscillator signals, which first pair is connected to switch radio frequency signals present on a first terminal, common to the first pair, of the radio frequency input port of the mixer core, and further comprising a second pair of switching transistors, each connected to switch, in anti-phase to the other of the second pair of switching transistors, in response to the local oscillator signals, which second pair is connected to switch radio frequency signals present on a second terminal, common to the second pair, of the radio frequency input port of the mixer core, wherein one transistor of each of the first and second pairs is connected to switch, in anti-phase with the other of the one transistor of each of the first and second pairs, the radio frequency signals to a first terminal of the output port and the other transistor of each of the first and second pairs is connected to switch, in anti-phase with the other of the other transistor of each of the first and second pairs, the radio frequency signals to a second terminal of the output port,
a DC detection circuit connected to receive the output of the mixer core and to provide a duty cycle adjustment control signal in response to the level of DC in the output of the mixer core, and
a duty cycle control circuit having a local oscillator input port, an input port connected to receive the duty cycle adjustment control signal provided by the DC detection circuit, and an output port connected to apply local oscillator signals received on the local oscillator input port of the duty cycle control circuit to the local oscillator input port of the mixer core, wherein each local oscillator signal is applied to the mixer core via a different component consisting essentially of a capacitor to each input of the mixer core local oscillator input port, wherein the duty cycle control circuit is arranged so to apply the duty cycle adjustment control signal to the local oscillator signals as to change the duty cycle of the first pair of transistors of the mixer core relative to the duty cycle of the second pair of transistors of the mixer core.

2. A double balanced mixer as claimed in claim 1, wherein the duty cycle control circuit is connected to apply the duty cycle adjustment control signal to the local oscillator signals received on the local oscillator input port of the duty cycle control circuit and to apply the resultant local oscillator signals to the first pair of transistors.

3. A double balanced mixer as claimed in claim 2 wherein the duty cycle control circuit is connected so to apply the duty cycle adjustment control signal to the local oscillator signals as to increase the duty cycle of one of the transistors of the first pair while reducing the duty cycle of the other transistor of the first pair and vice versa.

4. A double balanced mixer as claimed in claim 2 wherein the duty cycle control circuit is not connected to apply the duty cycle adjustment control signal to the local oscillator signals that are applied to the second pair of transistors.

5. A double balanced mixer as claimed in claim 2 wherein the duty cycle control circuit is connected to apply the duty cycle adjustment control signal to the local oscillator signals received on the local oscillator input port of the duty cycle control circuit and to apply the resultant local oscillator signals to the second pair of transistors.

6. A double balanced mixer as claimed in claim 5 wherein the duty cycle control circuit is connected so to apply the duty cycle adjustment control signal to the local oscillator signals as to increase the duty cycle of one of the transistors of the second pair while reducing the duty cycle of the other transistor of the second pair and vice versa.

7. A double balanced mixer as claimed in claim 1 wherein the duty cycle control circuit comprises components connected to add the duty cycle adjustment control signal to the local oscillator signals to adjust the DC level of the local oscillator signals.

8. A double balanced mixer as claimed in claim 1 wherein the duty cycle control circuit comprises components connected to adjust the duty cycle of the local oscillator signals before the local oscillator signals are applied to the mixer core.

9. A double balanced mixer as claimed in claim 1 wherein the duty cycle control circuit is connected to apply the duty cycle adjustment control signal to the mixer core to adjust the threshold voltages of the first pair of transistors, thereby applying the duty cycle adjustment control signal to the local oscillator signals and adjusting the duty cycle of the first pair of transistors.

10. A double balanced mixer as claimed in claim 9 wherein the duty cycle control circuit is connected to apply the duty cycle adjustment control signal to the mixer core to increase the threshold voltage of one of the transistors of the first pair while decreasing the threshold voltage of the other transistor of the first pair and vice versa.

11. A double balanced mixer as claimed in claim 9 wherein the duty cycle control circuit is connected not to affect the threshold voltages of the second pair of transistors.

12. A double balanced mixer as claimed in claim 9 wherein the duty cycle control circuit is connected to affect the threshold voltages of the second pair of transistors.

13. A double balanced mixer as claimed in claim 12 wherein the duty cycle control circuit is connected so to apply the duty cycle adjustment control signal to increase the duty cycle of one of the transistors of the second pair while reducing the duty cycle of the other transistor of the second pair and vice versa.

14. A double balanced mixer as claimed in claim 13 wherein the duty cycle control circuit is connected to apply the duty cycle adjustment control signal to the mixer core to increase the threshold voltage of one of the transistors of the second pair while decreasing the threshold voltage of the other transistor of the second pair and vice versa.

15. A double balanced mixer circuit as claimed claim 9 wherein the duty cycle control circuit is connected to apply the duty cycle adjustment control signal to the substrate connections of the first and second pairs of transistors of the mixer core.

16. A double balanced mixer as claimed in claim 1, wherein the duty cycle control circuit is connected so to apply the duty cycle adjustment control signal to the local oscillator signals as to increase, and to reduce at other times, the duty cycle of the transistor of the first pair and the transistor of the second pair that are connected to the first output terminal of the output port of the mixer core together at the same time.

17. A double balanced mixer as claimed claim 1 wherein the DC detection circuit comprises an integrator or lowpass filter.

18. A double balanced mixer as claimed in claim 1 further comprising a filter connected to the output port of the mixer core to transfer the output of the mixer core to the input of the DC detection circuit, wherein the filter is arranged to pass frequencies higher than frequencies passed by the DC detection circuit but to block yet higher frequencies.

19. A double balanced mixer as claimed in claim 18 wherein the output of the filter provides a baseband output port for the double balanced mixer.

20. A double balanced mixer as claimed in claim 1 wherein the duty cycle control adjustment signal represents a single value.

21. A double balanced mixer as claimed in claim 20 wherein the duty cycle adjustment control signal is a differential signal.

22. A double balanced mixer as claimed in claim 1 which further comprises an input stage connected to input signals to the mixer core, the input stage comprising:
 an input terminal for receiving signals,
 an input stage transistor connected to transfer the signals from the input terminal to the mixer core, and
 a feedback circuit connected between a control input of the input stage transistor and the input terminal,
 wherein the feedback circuit comprises a filter operative to block relatively high frequency signals and to pass relatively low frequency signals.

23. A double balanced mixer as claimed in claim 22 wherein the filter is a low pass filter.

24. A double balanced mixer as claimed in claim 22 wherein the filter is a band pass filter.

25. A double balanced mixer as claimed in claim 22 wherein the feedback circuit comprises an amplifier.

26. A double balanced mixer as claimed in claim 25 wherein the output of the amplifier is connected to the control input of the input stage transistor and the filter is connected between the input terminal of the input stage and an input of the amplifier.

27. A double balanced mixer as claimed in claim 26 wherein the amplifier has an inverting input and the filter is connected to the inverting input of the amplifier.

28. A double balanced mixer as claimed in claim 22 wherein the input stage transistor is a field effect transistor and the control terminal is the gate of the field effect transistor.

29. A double balanced mixer as claimed in claim 22 wherein the input stage transistor is a field effect transistor and the input terminal of the double balanced mixer is the source of the field effect transistor.

30. A double balanced mixer as claimed in claim 22 wherein the input stage transistor is a bipolar transistor and the control terminal is the base of the bipolar transistor.

31. A double balanced mixer as claimed in claim 22 wherein the input stage transistor is a bipolar transistor and the input terminal of the double balanced mixer is the emitter of the bipolar transistor.

32. A double balanced mixer as claimed in claim 22 further comprising a bias circuit connected between a power supply terminal and the input terminal of the input stage.

33. A double balanced mixer as claimed in claim 32 wherein the bias circuit comprises a resistor.

34. A double balanced mixer as claimed in claim 33 wherein the bias circuit comprises an inductor in series with the resistor.

35. A double balanced mixer as claimed in claim 22 comprising two of the input stages, wherein the input stages are connected to transfer signals to respective ones of a pair of differential inputs to the mixer core.

36. A double balanced mixer as claimed in claim 22 comprising two of the input stages, wherein each input stage comprises an amplifier, and the mixer comprises an offset integrator connected to be responsive to the input offsets of the two amplifiers and to provide outputs to the amplifiers to reduce the input offsets.

37. A double balanced mixer as claimed in claim 22 comprising an input filter, having an input port and an output port, connected to filter signals before the signals are passed to the radio frequency input port of the mixer core, the filter passing relatively high frequency signals and blocking relatively low frequency signals.

38. A double balanced mixer as claimed in claim 37 wherein the input filter is a highpass filter.

39. A double balanced mixer as claimed in claim 37 wherein the input filter is a bandpass filter.

40. A double balanced mixer as claimed in claim 37 wherein the input filter is a passive network.

41. A double balanced mixer as claimed in claim 40 wherein the input filter comprises a capacitor connected between the input and output ports of the filter.

42. A double balanced mixer as claimed in claim 41 wherein the input filter further comprises an inductor connected between the input and output ports of the filter in series with the capacitor.

43. A double balanced mixer as claimed in claim 40 further comprising an inductor connected between the input port of the inductor and a power supply terminal.

44. A double balanced mixer as claimed in claim 37 further comprising two of the input filters, wherein the input filters are connected to pass signals to respective ones of a pair of differential inputs to the mixer core.

45. A double balance mixer as claimed claim 37 wherein the output port of the input filter is connected to the input terminal of the input stage.

46. A double balanced mixer as claimed in claim 37 further comprising an input amplifier having an output connected to the input port of the input filter.

47. A double balanced mixer as claimed in claim 46 wherein the input amplifier having an output connected to the input port of the input filter is a transconductor amplifier.

48. A double balanced mixer as claimed in claim 1 wherein the duty cycle control circuit is responsive to the duty cycle adjustment control signal as to change the duty cycle so as to reduce the DC component in the output of the mixer core.

49. A double balanced mixer as claimed in claim 1, further comprising a transimpedance amplifier connected to receive the output of the mixer core and having an amplifier output connected to provide the amplifier output to the DC detection circuit.

50. A double balanced mixer as claimed in claim 1 wherein the duty cycle control circuit includes first and second capacitors connected to capacitively couple first and second anti-phase phases of the local oscillator signals respectively to first and second nodes of the local oscillator input port to switch each of the transistors of the first pair of transistors respectively and in anti-phase.

51. A double balanced mixer as claimed in claim 50 wherein the duty cycle control circuit further includes first and second resistors respectively connected to the first and second nodes of the local oscillator input port of the mixer core to provide the first and second nodes with first and second components of the duty cycle adjustment control signal respectively.

52. A double balanced mixer as claimed in claim 1 wherein the duty cycle control circuit includes first and second capacitors connected to capacitively couple respective ones of two anti-phase phases of the local oscillator signals to respective first and second nodes of the local oscillator input port to switch respective ones of the first pair of transistors in anti-phase, and comprises third and fourth capacitors connected to capacitively couple respective ones of the two anti-phase phases of the local oscillator signals to respective third and fourth nodes of the local oscillator input port to switch respective ones of the second pair of transistors in anti-phase.

53. A double balanced mixer as claimed in claim 52 wherein the duty cycle control circuit further includes first and second resistors respectively connected to the first and second nodes of the local oscillator input port of the mixer to provide those with first and second components of the duty cycle adjustment control signal respectively, and comprises third and fourth resistors respectively connected to third and fourth nodes of the local oscillator input port of the mixer to provide those with the first and second components of the duty cycle adjustment control signal respectively.

54. A double balanced mixer as claimed in claim 8 wherein the components connected to adjust the duty cycle of the local oscillator signals before they are applied to the mixer core comprise a variable delay element connected to receive the local oscillator signal and to provide a delay controlled by the duty cycle adjustment signal.

55. A double balanced mixer as claimed in claim 9 wherein the duty cycle adjustment signal is connected to substrate connections of the transistors of the mixer core.

* * * * *